United States Patent [19]

Ragaly

[11] 4,303,935
[45] Dec. 1, 1981

[54] SEMICONDUCTOR APPARATUS WITH ELECTRICALLY INSULATED HEAT SINK

[75] Inventor: Istvan Ragaly, Schwieberdingen, Fed. Rep. of Germany

[73] Assignee: Robert Bosch GmbH, Stuttgart, Fed. Rep. of Germany

[21] Appl. No.: 965,743

[22] Filed: Dec. 4, 1978

[30] Foreign Application Priority Data

Dec. 13, 1977 [DE] Fed. Rep. of Germany ....... 2755404
Feb. 9, 1978 [DE] Fed. Rep. of Germany ....... 2838342
Sep. 2, 1978 [DE] Fed. Rep. of Germany ....... 2838412

[51] Int. Cl.³ .................. H01L 23/32; H01L 23/28; H01L 23/02
[52] U.S. Cl. ........................................ 357/76; 357/81; 357/80; 357/79; 357/74; 357/72
[58] Field of Search .................... 357/72, 74, 79, 81, 357/76, 80

[56] References Cited

U.S. PATENT DOCUMENTS

| | | | |
|---|---|---|---|
| 2,516,344 | 7/1950 | Ross et al. | 357/72 |
| 2,817,048 | 12/1957 | Thuermel et al. | 357/81 |
| 2,864,006 | 12/1958 | Vandeven | 357/81 |
| 2,887,628 | 5/1959 | Zierdt | 357/81 |
| 2,938,130 | 5/1960 | Noll | 357/48 |
| 2,967,984 | 1/1961 | Jamison | 357/81 |
| 3,179,855 | 4/1965 | Brombaugh | 357/79 |
| 3,275,921 | 9/1966 | Fellendorf et al. | 357/81 |
| 3,377,524 | 4/1968 | Bock et al. | 357/81 |
| 3,377,525 | 4/1968 | Bradstock | 357/81 |
| 3,439,255 | 4/1969 | Carnes et al. | 357/80 |
| 3,476,979 | 11/1969 | Stumpe et al. | 357/76 |
| 3,721,868 | 3/1973 | Smith | 357/76 |
| 3,743,896 | 7/1973 | Weiske et al. | 357/81 |
| 3,763,403 | 10/1973 | Lootens | 357/81 |
| 3,780,322 | 12/1973 | Walters | 357/76 |

FOREIGN PATENT DOCUMENTS

| | | | |
|---|---|---|---|
| 1973009 | 11/1967 | Fed. Rep. of Germany | 357/76 |
| 1251837 | 11/1971 | United Kingdom | 357/76 |
| 1328351 | 8/1973 | United Kingdom | 357/76 |

*Primary Examiner*—Andrew J. James
*Attorney, Agent, or Firm*—Frishauf, Holtz, Goodman & Woodward

[57] ABSTRACT

A semiconductor element, either a diode or a controlled rectifier, is electrically insulated relative to the heat sink on which it is mounted by either an insulating layer or an insulating diode of high thermal conductivity. A single unit including the heat sink with a plurality of diodes is used as a bridge rectifier in single phase or polyphase circuits.

24 Claims, 28 Drawing Figures

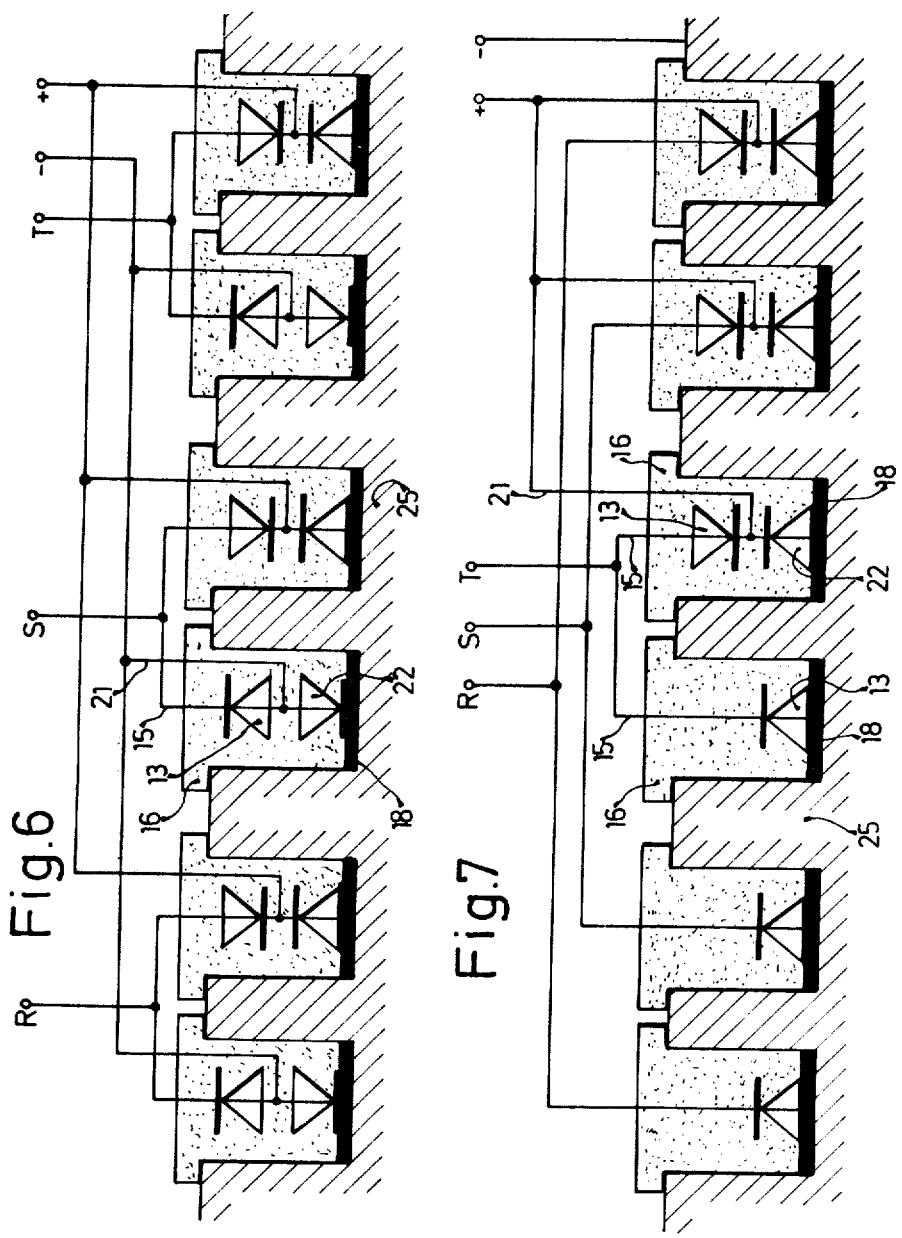

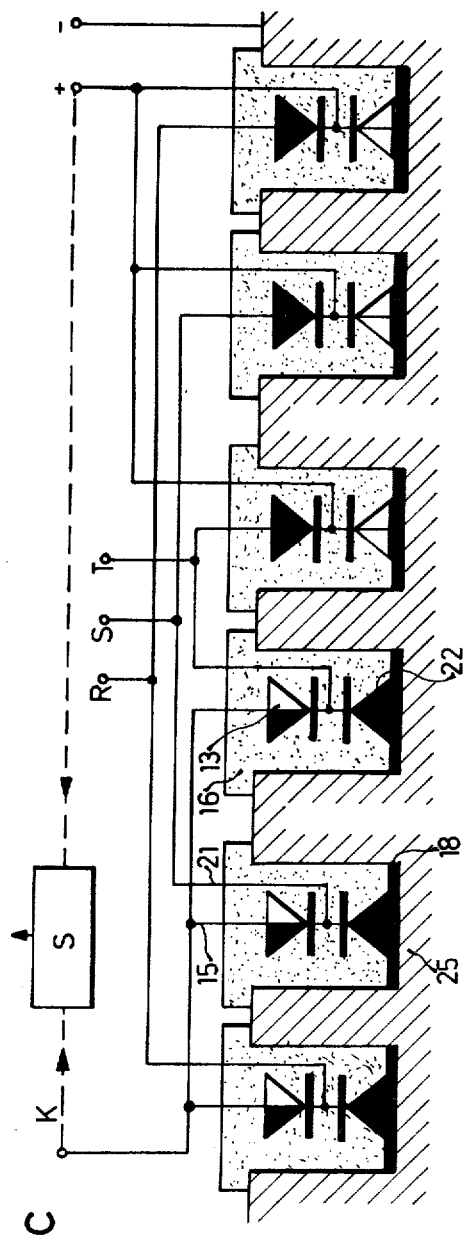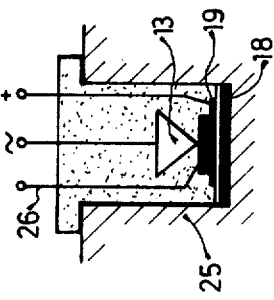

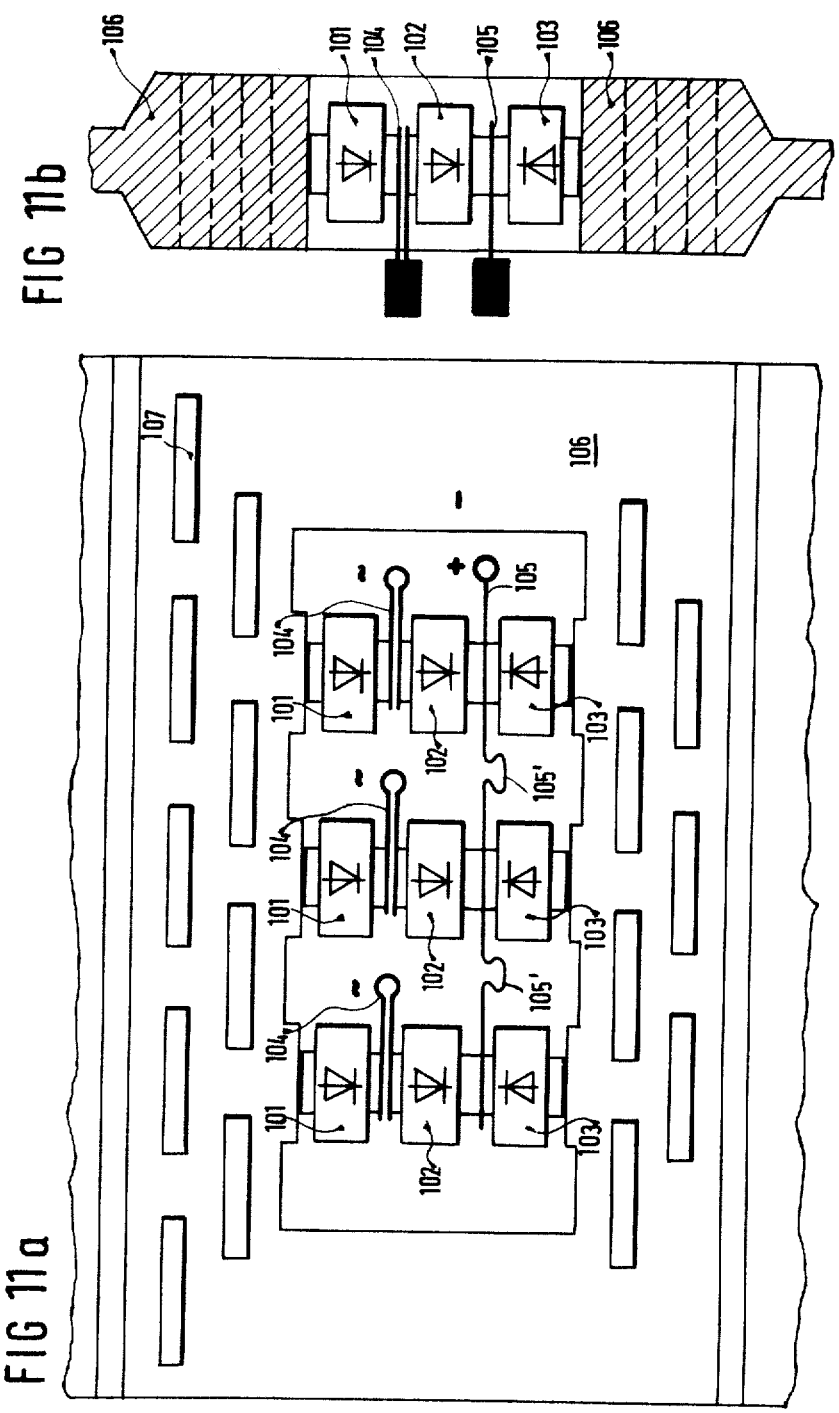

2

SEMICONDUCTOR APPARATUS WITH ELECTRICALLY INSULATED HEAT SINK

CROSS REFERENCE TO RELATED APPLICATIONS OR PUBLICATIONS

The present application relates to apparatus as disclosed in:
DT-OS No. 1,589,553;
DT-GM No. 1,973,014;
DT-GM No. 1,973,009;
DT-PS No. 1,613,040.

The present invention relates to semiconductor apparatus and, specifically, to semiconductor apparatus which includes at least one semiconductor element such as a diode and a heat sink on which the semiconductor element is mounted.

BACKGROUND AND PRIOR ART

Semiconductor equipment is known, for example as described in DT-OS No. 1,589,553 and DT-GM No. 1,973,014, in which a semiconductor chip is directly positioned on a heat sink. In these known arrangements, a sheath surrounds the semiconductor element and the conductor which provides electric connection to the semiconductor passes through the sheath and is electrically insulated therefrom. Further, DT-GM No. 1,973,009 discloses a semiconductor building element in which two diodes are mounted on the same heat sink, each diode being individually enclosed in a sheath. The electrical conductor required to make contact with each diode passes through the respective sheath and is electrically insulated therefrom. In all of these known arrangements the semiconductor element is not insulated from the heat sink but is, for example, soldered thereto. It is not possible to maintain the heat sink at a neutral potential or to mount diodes of different polarity on a single heat sink. Thus, for bridge rectifiers for generators in internal combustion engines, where diodes mounted on heat sinks are used, two separate heat sinks are required as, for example, shown in DT-PS No. 1,613,040.

THE INVENTION

It is an object of the present invention to furnish a building block including a semiconductor element and a heat sink in which the heat sink is at the same potential through or at an electrically neutral potential, that is without an electrical connection to one of the electrodes of the semiconductor element. It is a further object of the present invention to create a semiconductor building block which requires a smaller volume, has improved mechanical and electrical characteristics and operates reliably even in adverse ambient conditions.

In accordance with the present invention, electrical insulator means such as an insulating layer or an insulating diode having a high thermal conductivity is interposed between the semiconductor element and the metallic base member constituting the heat sink, for electrically insulating said metallic base member from said semiconductor element. For bridge rectifier circuits all diodes may be mounted on the same metallic base.

Further advantages of the invention are that the manufacturing process for the diodes must only be changed minimally. For a defective semiconductor element only the single building unit must be discarded and not, as is the case for integrated rectifier circuits—the complete bridge circuit. Further, standard diode units may be used throughout, that is the units may be manufactured with two diodes connected in series with opposite polarity, only one of these diodes being utilized. This allows complete interchangeability. The amount of waste during the manufacture of complete bridge circuits is thus further decreased.

DRAWINGS ILLUSTRATING A PREFERRED EMBODIMENT

FIGS. 4-9 show a number of circuits utilizing a plurality of semiconductor arrangements in accordance with the present invention.

FIGS. 10a and 10b shows an embodiment using a controllable semiconductor element in conjunction with an insulating diode and insulating layer, respectively.

Figure 11C:
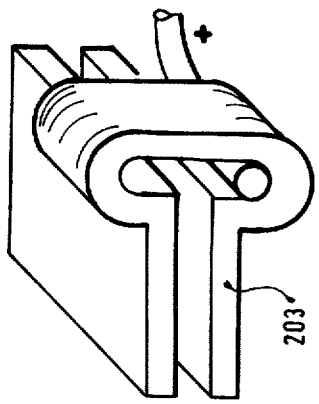
Figure 16:
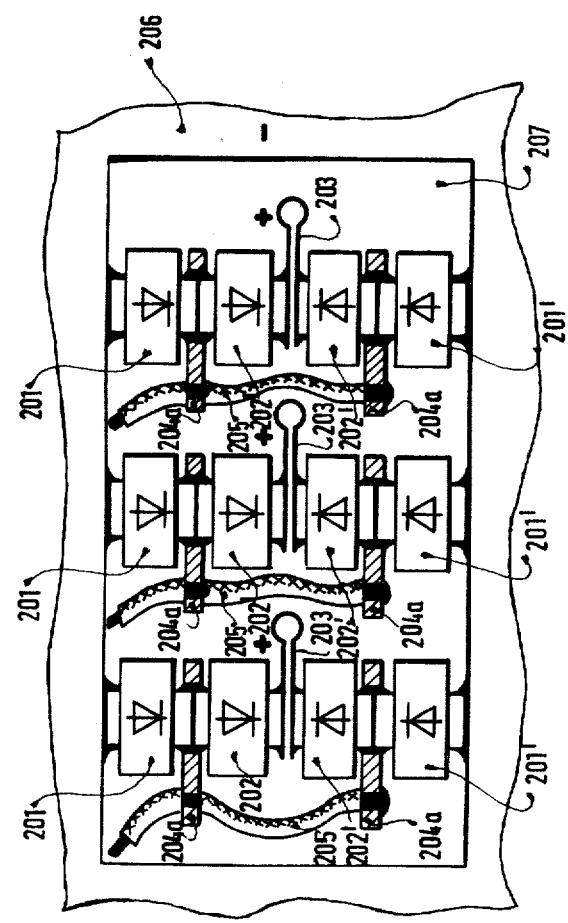
Figure 12:
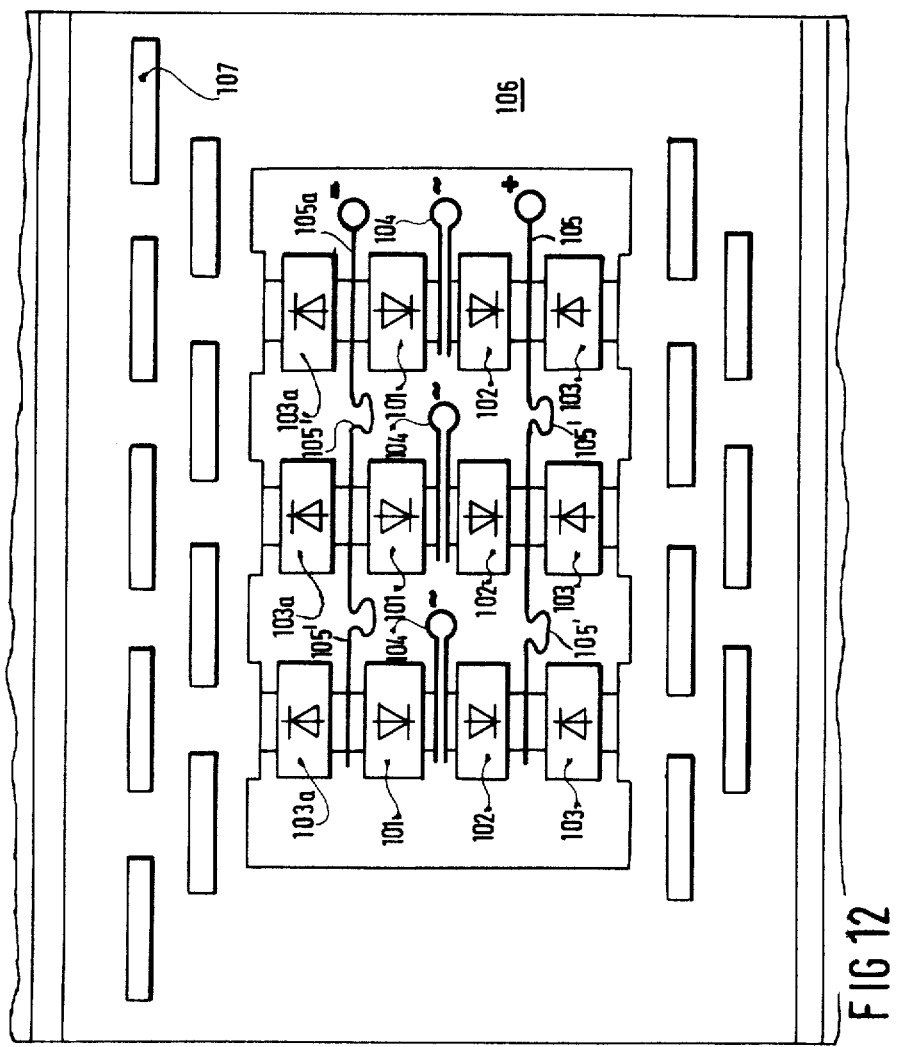
Figure 13:
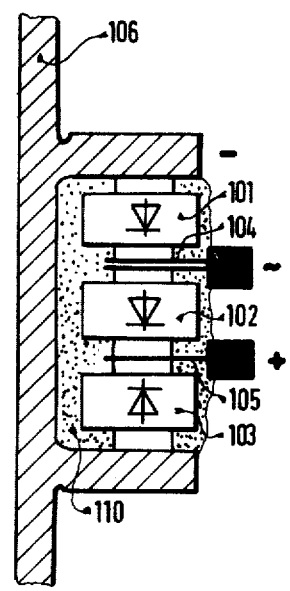
Figure 14:
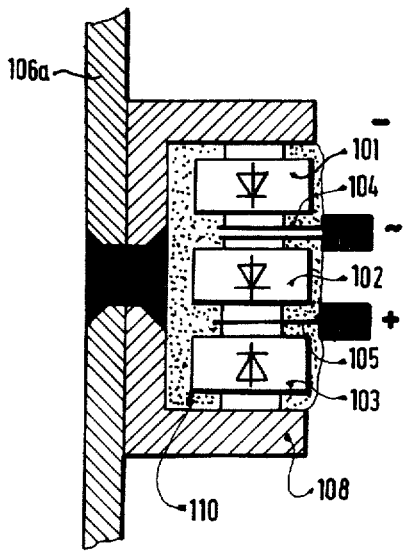
Figure 15A:
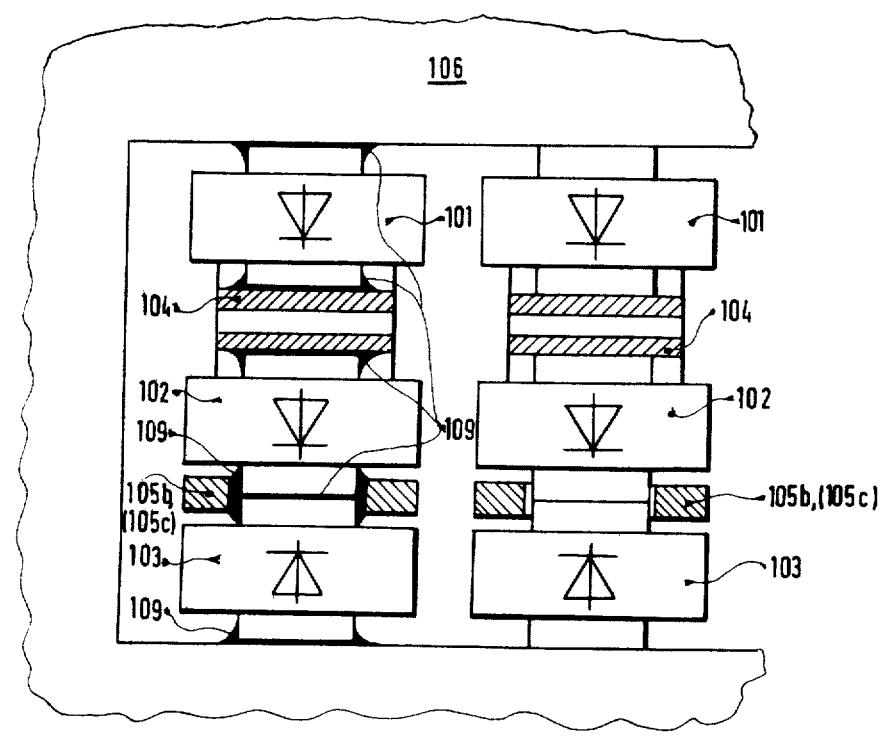
Figure 15B:
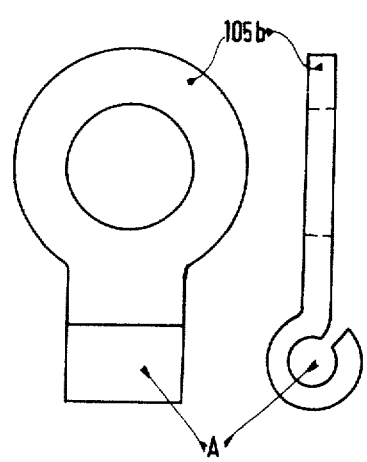
Figure 15C:
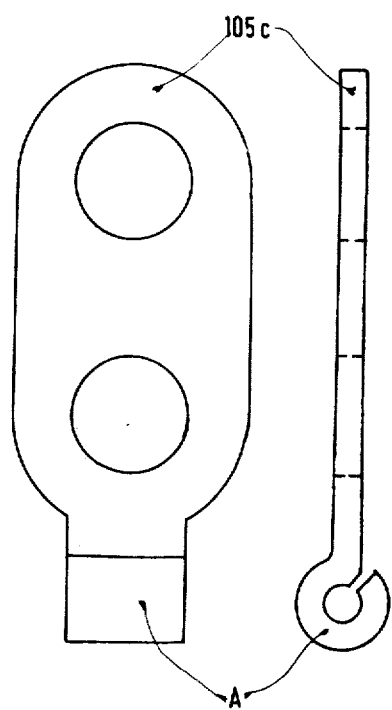
Figure 17:
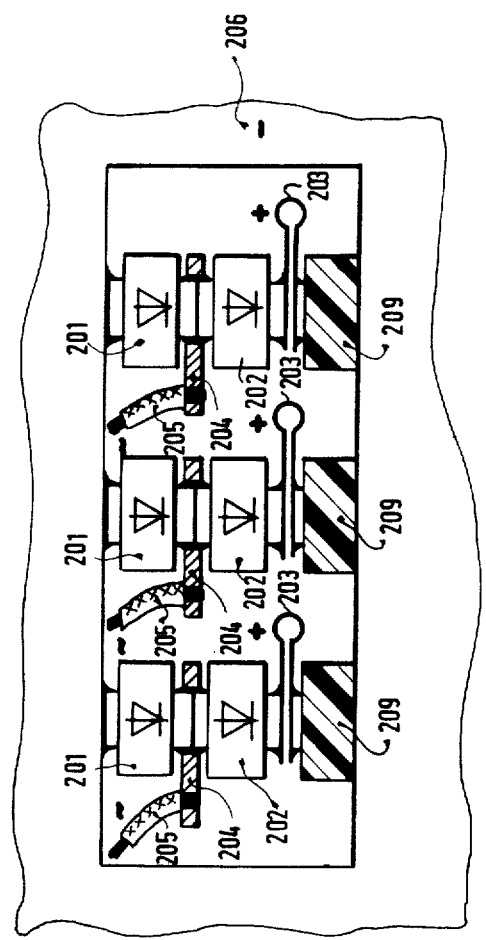

FIGS. 11a-11c and AC bridge rectifier system with unipotential heat sink and using single diodes;

FIG. 12 shows a single diode rectifier arrangement with heat sink at chassis potential;

FIG. 13 shows a diode column built into a single heat sink;

FIG. 14 shows a diode column built into a two-part heat sink;

FIGS. 15a-15c show a single diode rectifier arrangement with contact pieces for connection of flexible conductors;

FIG. 16 shows an alternate embodiment of a bridge rectifier arrangement with a unipotential heat sink;

FIG. 17 shows a third embodiment of an AC bridge rectifier system.

In bridge circuits using semiconductor elements, for example in AC bridge circuits, known apparatus utilizes two or three separate heat sinks. The heat sinks perform two functions. First, the heat resulting from the losses in the semiconductor is to be conducted away and, secondly, a mechanical unit is to be created. The proper electrical connection or insulation of the individual semiconductor elements must be provided which, when known building blocks are used which require two or three different potential levels, require two or three different heat sink systems. Since the heat sinks must be electrically insulated from each other, a relatively complicated construction and a relatively large volume result. Further, the insulation of the heat sinks relative to each other and, possibly, relative to the housing must be maintained even under very adverse ambient conditions.

Figure 1:
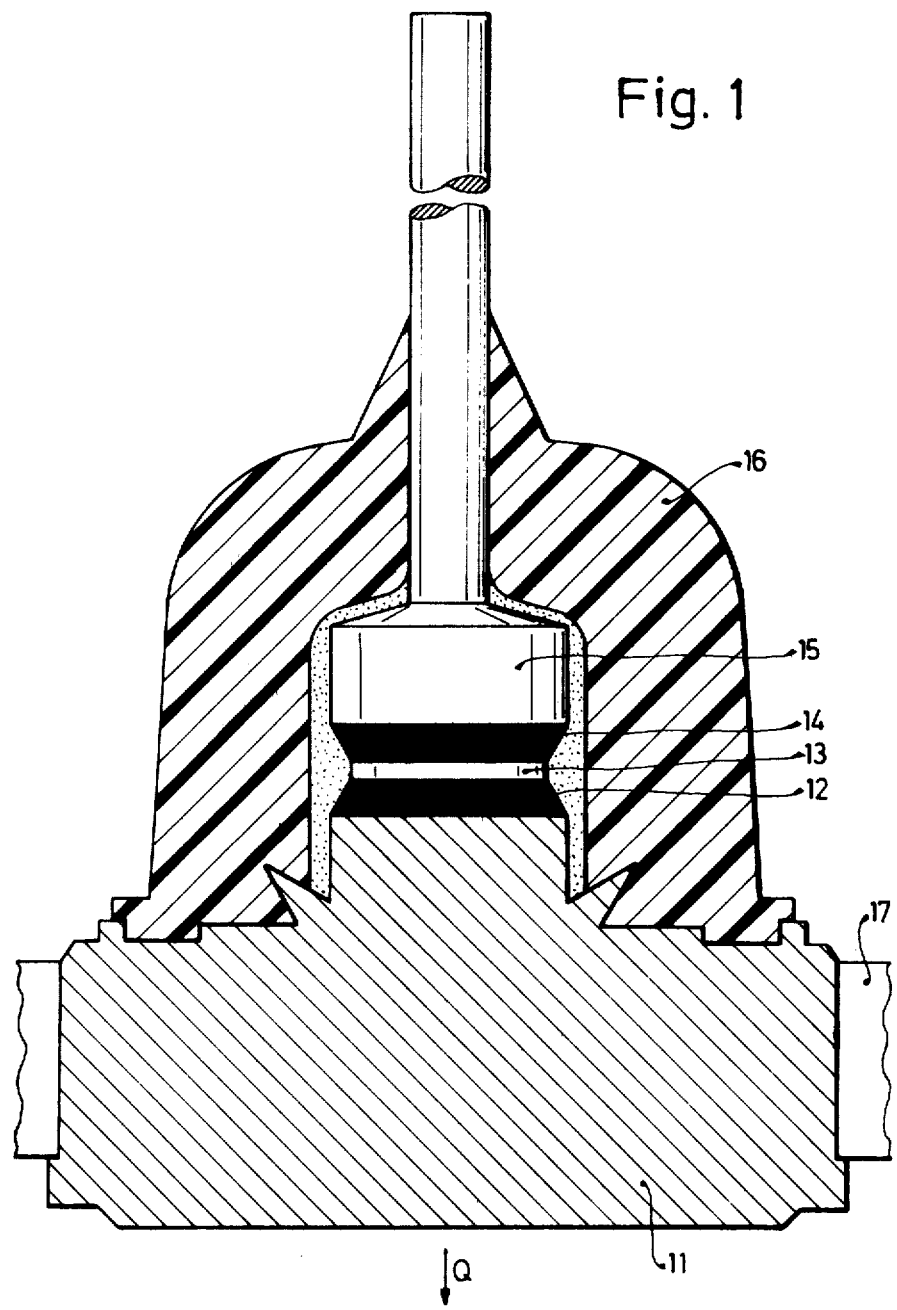
FIG. 1 shows a prior art semiconductor arrangement.

FIG. 1 shows a known semiconductor unit. A base 11 serves as a heat sink. A first layer of solder is denoted by reference numeral 12, the semiconductor element by reference numeral 13 and a second solder layer by reference numeral 14. Reference numeral 15 indicates the electrical conductor, while reference numeral 16 indicates the sheath. The base 11 is pressed into a plate 17 which constitutes the main heat sink.

Figure 2:
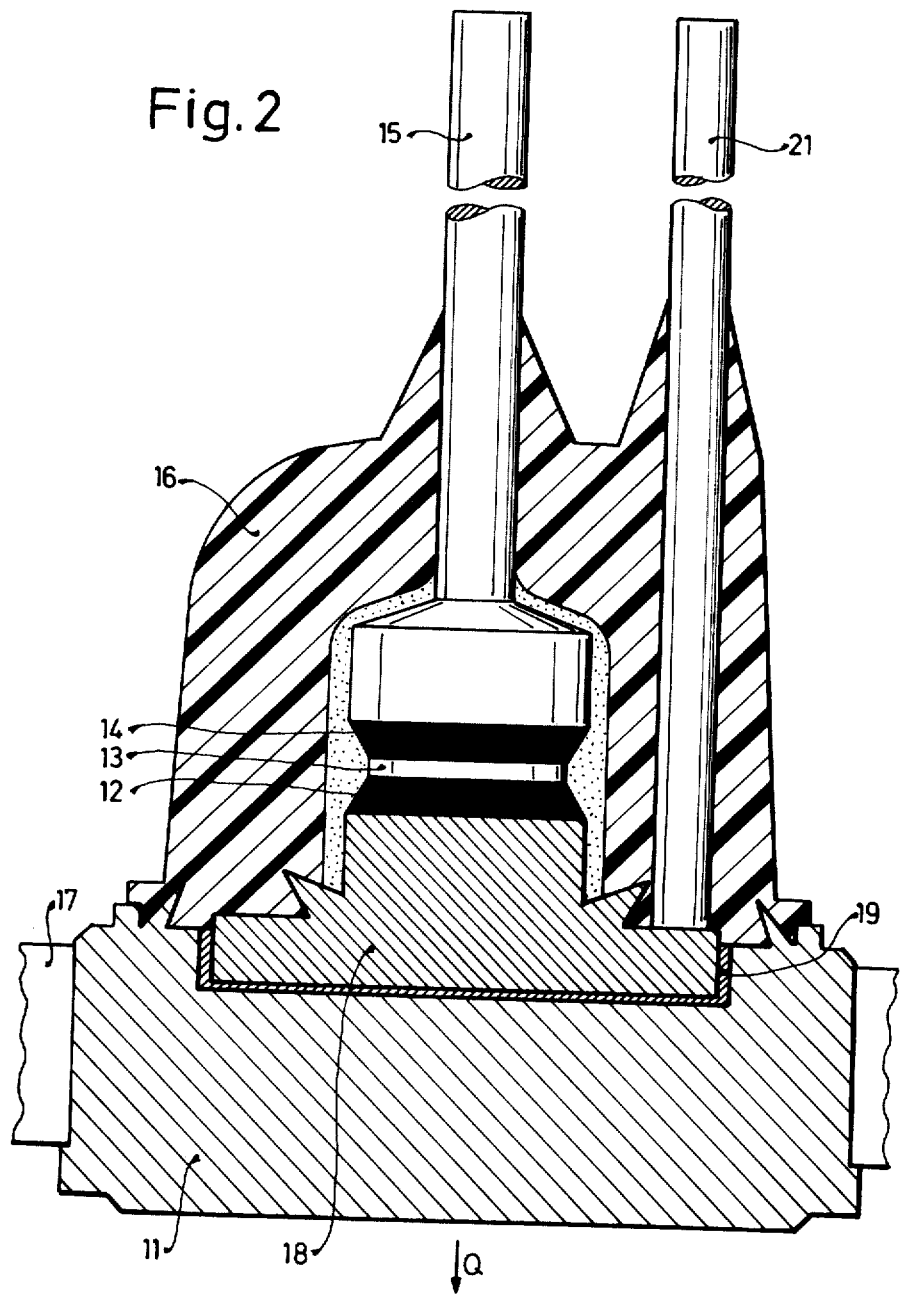
FIG. 2 shows a semiconductor arrangement according to the present invention using a single semiconductor element.

FIG. 2 shows a semiconductor unit in accordance with the present invention. The parts which are the same as those shown in FIG. 1 have the same reference numeral. Base 11 is again pressed into plate 17. Alternatively, plate 17 can be used directly as base 11, that is base 11 and plate 17 may be a single unit. Semiconductor element 13 of FIG. 2 is soldered onto a support 18 which is electrically insulated from base 11 by an insulating layer 19. However, support 18 is in good thermal contact with base 11 through insulating layer 19. A conductor 21 provides electrical contact with support 18 and passes through sheath 16 to the outside. It should be noted that support 18 and conductor 21 may be manufactured as a unit.

Insulating layer 19 is a very thin electrically insulating layer having high thermal conductivity and a high dielectric strength. It is mechanically very closely connected to base 11. In the embodiment shown on FIG. 2, sheath 16 together with base 11 and support 18 form a mechanical unit which must have sufficient strength to protect semiconductor element 13 and insulating layer 19 and to shield these elements from the environment. Since insulating layer 19 is so effectively protected, the layer may be a very thin layer as mentioned above. The thickness of insulating layer 19 is determined by its temperature characteristics and by its dielectric constant. For example, for an insulating layer 19 made of $Al_2O_3$ with a thickness of provides a sufficient dielectric strength and exhibits only a small temperature gradient even at full load.

Figure 3:
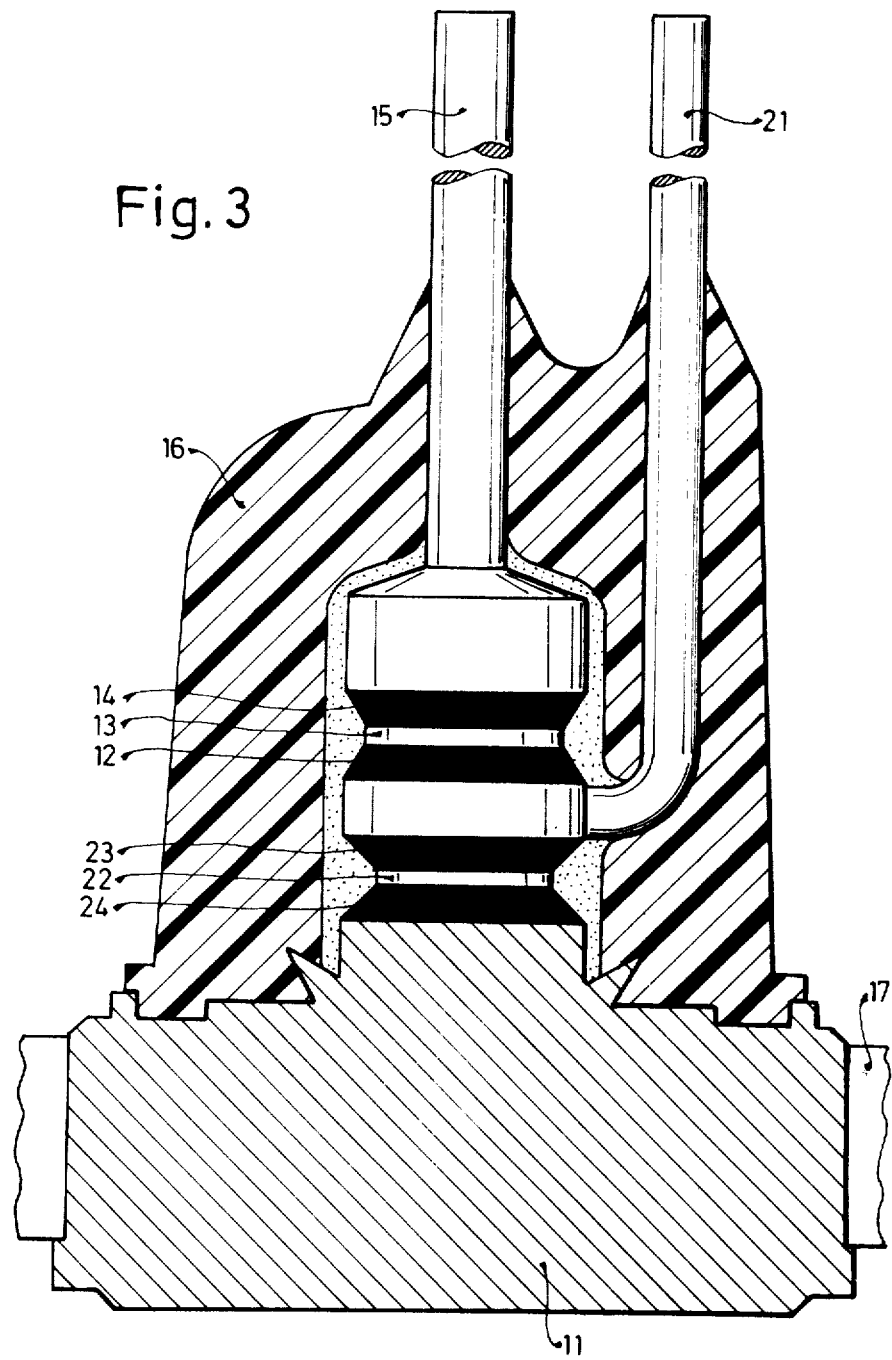
FIG. 3 shows a semiconductor arrangement according to the present invention with two semiconductor elements.

A second preferred embodiment of the present invention is shown on FIG. 3. In this embodiment, insulation is provided not by a layer 19 as shown in FIG. 2, but by an additional semiconductor element 22 which is connected in its blocked direction. A conductor 21 extends from the common point of semiconductor elements 13 and 22 to the outside. As mentioned in connection with FIG. 2, base 11 and plate 17 can again be manufactured as a single unit. The heating loss of semiconductor element 13 is conducted through layer 12, the corresponding part of conductor 21, further solder layers 23 and 24 and the additional semiconductor element 22 to base 11. Semiconductor elements 13 and 22 are connected with opposite polarity.

Diode arrangements as shown in FIGS. 2 and 3 are particularly advantageous when used as rectifier bridge circuits for three phase generators and, in particular, for three phase generators used in motor vehicles.

Figures 4, 5:
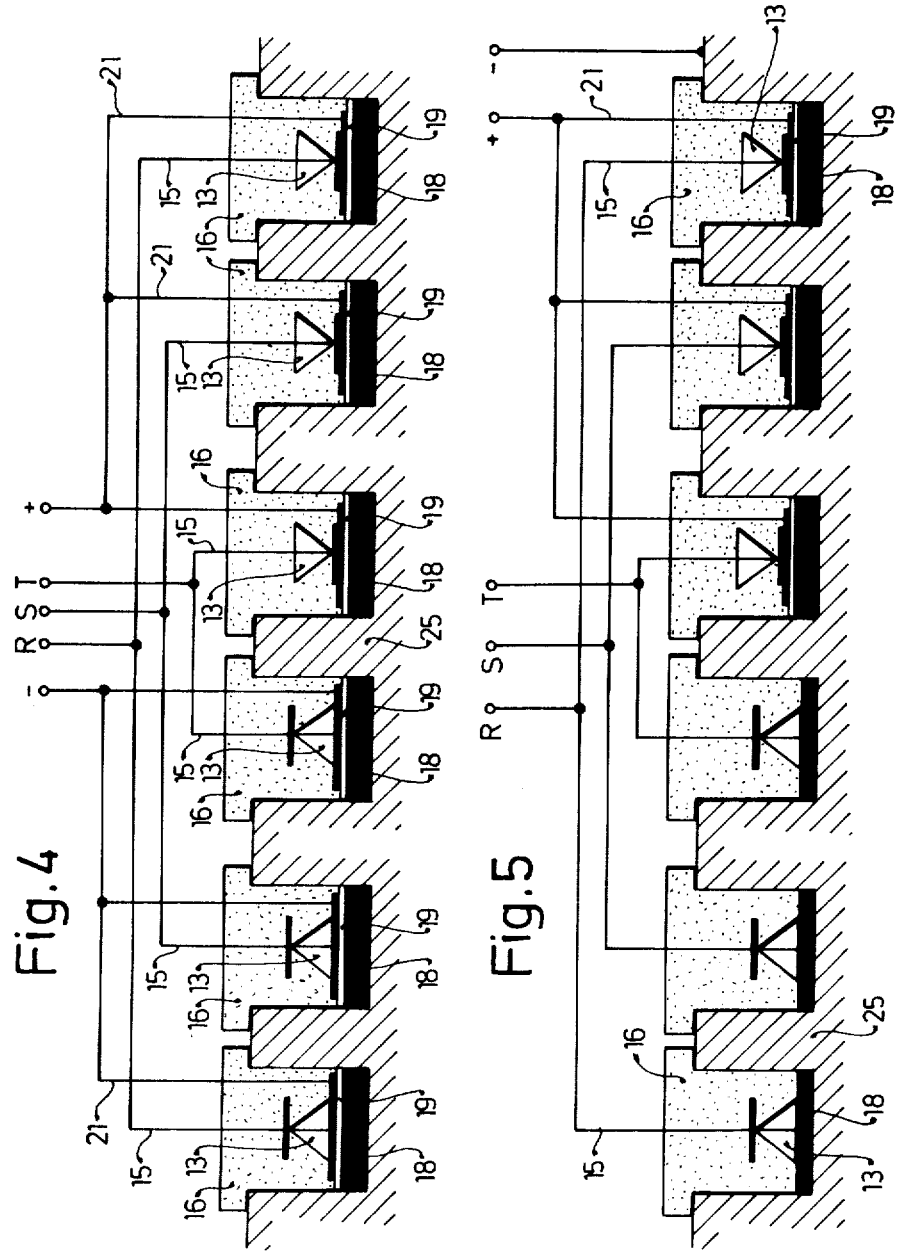

FIG. 4 shows a three phase bridge circuit in which a semiconductor arrangement as shown in FIG. 2, that is one utilizing an insulating layer 19, is pressed into a heat sink 25. Heat sink 25 constitutes a single unit incorporating base 11 and plate 17. In the embodiment of FIG. 4, heat sink 25 is free of potential. Three of the semiconductor elements 13 have a p layer in contact with heat sink 25. The remaining three have a n layer in contact with the heat sink. A conductor 15 is associated with each semiconductor element 13. A conductor 15 from each semiconductor element 13 of the first set is connected to a corresponding conductor 15 of a semiconductor element 13 of the second set. Each of the so-formed connections, R,S,T is suitable for connection to a phase of a three phase AC generator (not shown). All conductors 21 connecting to the semiconductor elements having a p layer in contact with heat sink 25 are connected together to form a positive output terminal. Similarly, all conductors 21 leading to semiconductor elements having the n layer in contact with heat sink 25 are connected together to form the negative output terminal. Preferably, semiconductor elements 13 are again mounted on a support member 18 which is pressed into heat sink 25. Semiconductor elements 13 are surrounded by a sheath 16. The heat generated by the losses in semiconductor elements 13 is conducted through insulating layer 19 and support 18 to heat sink 25 and from there is conducted to the surroundings.

If the particular operating conditions allow heat sink 25 to be at a particular potential, for example at the negative potential, then the second set of semiconductor elements 13 need not be insulated from heat sink 25. In this case, the second set of diodes need not be insulated diodes. This embodiment is shown on FIG. 5 and is a very economical embodiment for three phase generators in automotive vehicles.

FIGS. 6 and 7 show similar circuits as do FIGS. 4 and 5, but the insulating means in FIGS. 6 and 7 are semiconductor elements 22 as shown in FIG. 3. The reference numerals are the same as those used in the preceding figures.

Figure 8A:
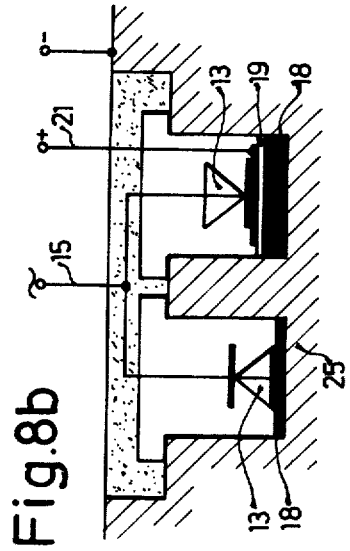
Figure 8B:
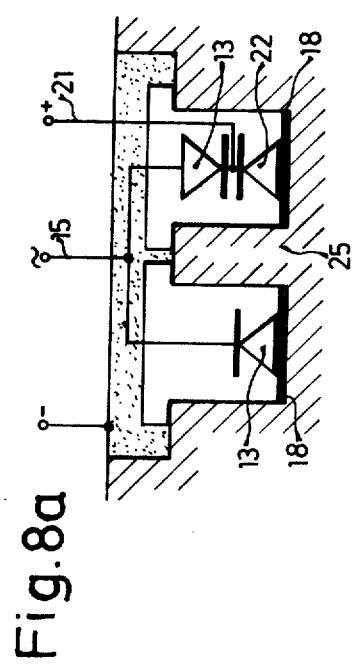

FIG. 8a shows an embodiment in which a semiconductor element 13 as shown in FIG. 1 and semiconductor element 13 insulated by means of a further semiconductor element 22 as shown in FIG. 3 are arranged together in a recess in heat sink 25. FIG. 8b shows an embodiment of the same arrangement in which an insulating layer 19 replaces the insulating diode 22. In both FIGS. 8a and 8b the negative output terminal is connected to heat sink 25, the positive output terminal to conductor 21 and the AC input is received at conductor 15. As shown in FIG. 9, a bridge rectifier circuit and, in particular, a three phase bridge rectifier circuit used in automotive vehicles, can be constructed using only a single type of semiconductor arrangement, namely the arrangement shown in FIG. 3. Since only a single type of unit is required, the possibility of the substitution of an incorrect part either during manufacture or during repair is eliminated.

Figure 9A:
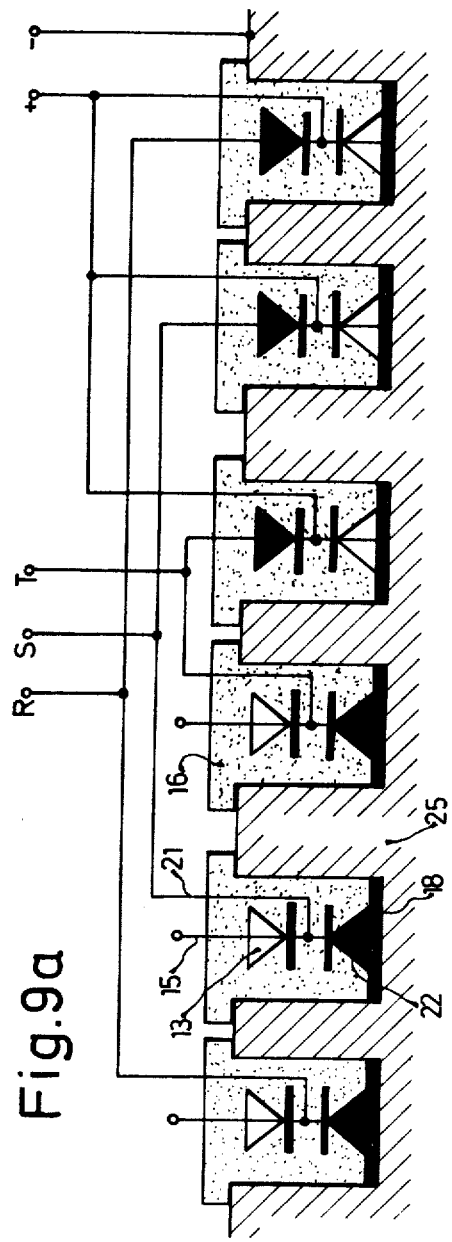

In FIG. 9a, in which the same reference numerals are again used as were used in the previous figures, an embodiment is shown in which the three semiconductor elements 13 which are shown on the right hand side of the figure are conductive depending on the phase angle of the AC current, while the semiconductor elements 22 shown in the right hand side of the figure are always blocked. No connection is made to the three diodes 13 on the left hand side of the figure, while diodes 22 on the left hand side of the figure are conductive depending upon the direction of the AC current. The three current conducting diodes 13 on the right hand side of the figure constitute positive diodes, the three current conducting diodes 22 on the left hand side of the figure constitute the negative diodes. The negative output terminal is therefore connected to heat sink 25. The three conductors 21 on the right hand side of the figure are connected together to form the positive terminal. Each conductor 15 making a connection to a diode 13 on the right hand side of the picture is connected to a conductor 21 making a connection to a diode 22 on the left hand side of the figure. The so-connected conductors are connected to terminals R, S and T which constitute the three phase AC terminals. The three current conducting diodes on the right hand side of the figure are in indirect thermal contact with heat sink 25, while the three current conducting diodes on the left hand side of the figure are in direct thermal contact with the heat sink 25.

Figure 9B:
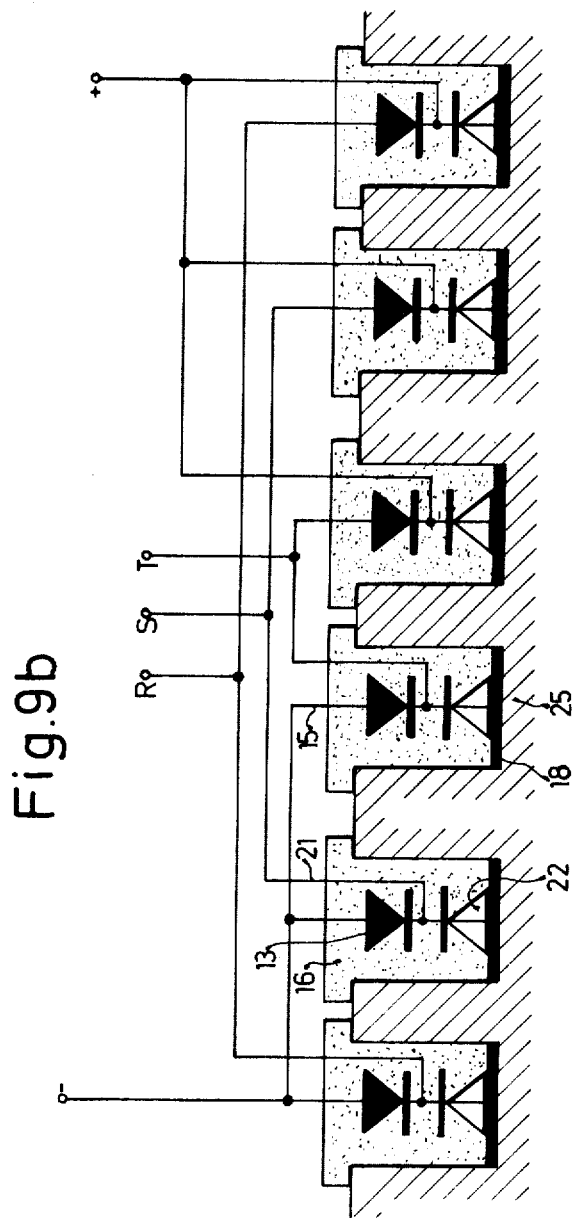

The connections in FIG. 9b are somewhat different from those shown in FIG. 9a. The three conductors 21 on the right hand side of the figure are connected together to form the positive output terminal, while the three conductors 15 on the left hand side of the figures are connected together to form the negative terminal. Each conductor 15 from the right hand side of the figure is connected to a conductor 21 from the left hand side of the figure. The so-connected conductors are connected to terminals R, S, T, that is the three phase AC terminals. In this embodiment all current conducting diodes 13 are in indirect thermal contact with heat sink 25.

The embodiment shown in FIG. 9c is similar to that shown in FIG. 9a. However, the terminals connecting to conductors 15 on the left hand side of the figure which were left free in FIG. 9a are all connected to a control terminal K. A signal generator S is connected between terminal K and the positive output terminal. Signal generator S may, for example, be utilized to activate a switch in dependence on the generator output voltage. FIG. 10 shows an embodiment of the present invention in which the semiconductor element 13 is a controllable semiconductor. In FIG. 10a the semiconductor element 13 is insulated from the heat sink 25 by a diode 22, while in FIG. 10a it is insulated from heat sink by an insulating layer 19. In both cases, a conductor 26 which permits connection to the control electrode of the semiconductor element is provided. The controllable semiconductor element may, for example, be a thyristor.

FIG. 11a shows an AC bridge rectifier circuit with a unipotential heat sink and utilizing button diodes. Button diodes 101 constitute the minus diodes and button diodes 102 the plus diodes. Heat losses which are generated in diodes 101 and 102 dissipate for the most part conductively to housing 106. In the case of diode 101 the conduction takes place directly, while in the case of diode 102 the heat is conducted through diodes 103 which are in the blocked state, that is electrically passive. Since heating of diodes 103 results only from the reverse currents and since the internal thermal resistance of the diodes is low, the heat generated in diodes 102 can very readily be conducted to cooler housing 106 by these diodes. Diodes 101, 102 and 103 are arranged as a column in the main recess of housing 106. The latter thus constitutes not only the heat sink but a supporting member and housing for the diodes. Contact pieces 104 are soldered between diodes 101 and 102. As shown in greater detail in FIG. 11c, these contact pieces are substantially U shaped. One leg of the contact piece is soldered to the cathode of diode 101 while the other is soldered to the anode of diode 102. This particular construction of contact piece 104 (here denoted by reference numeral 203) not only provides the necessary electrical connections, that is contact between the individual diodes 101 and diodes 102 and a terminal for the relevant phase of the AC winding of the generator, but also constitutes a thermal connection between the minus diodes 101 and plus diodes 102. Additionally, mechanical tensions which might be generated in the columns constituted by diodes 101, 102 and 103 during operation of the rectifier system are decreased by the resilient yielding of both legs of the contact piece. A contact piece 105 is soldered to the cathode of insulating diode 103 and the cathode of diode 104. For an AC bridge rectifier circuit, contact piece 105 extends through all three rectifier columns and constitutes the positive bus bar. To eliminate mechanical tensions in the diode columns which may result from differences in heating or due to a deformation of heat sink 106, contact piece 105 is also constructed to have resiliency in its lengthwise direction. For example loops 105' may be provided. The anodes of all positive diodes 102 and the anodes of all insulating diodes 102 are soldered to contact piece 105. It should be noted that although three insulating diodes 103 are shown, either two or four insulating diodes 103 could be provided. Further, openings 107 are provided in housing 106 for introduction of a cooling medium.

FIG. 12 shows a rectifier arrangement according to the present invention in which the heat sink is at reference potential, that is ground or chassis potential. Contrary to the arrangement shown in FIG. 11, negative diodes 101 are not directly connected to housing 106, but are electrically insulated relative to housing 106 by diodes 103a which are connected in the blocking direction. A contact piece 105a is soldered between diodes 101 and the insulating diodes 103a. Contact piece 105a constitutes a bus bar for the negative output. Again, the number of insulating diodes 103a may be varied according to the application.

In FIG. 13 an embodiment is shown in which the column of diodes 101, 102 and 103 is directly mounted between the walls of housing 106 which serves both as a supporting member and as a heat sink.

In FIG. 14, the arrangement is divided into two parts. Part 108 constitutes the support for the diodes, while part 106a constitutes the heat sink. FIGS. 14 and 13 also illustrate that the diode column may be surrounded by an insulating potting compound which also protects diodes 101, 102 and 103 from the environment.

FIG. 15 shows an embodiment in which bus bars 105, 105a are replaced by individual contact studs 105b (one column) or 105c for a double column of all diodes of one phase. Diodes 102 and 103 are soldered directly to each other. This decreases the thermal resistance to heat sink 106. Contact studs 105b, 105c are flexibly connected to each other and to the positive output terminal of the generator by, for example, a cable.

FIG. 16 shows an alternate embodiment of an AC bridge rectifier arrangement in which the heat sink is a unipotential body. Button diodes 201, 201' each have an anode connected to the negative output, in this case the heat sink potential, while diodes 202, 202' each have a cathode connected to the positive output terminal. Diodes 201, 202' are directly soldered onto diodes 202, 202'. The heat loss which is generated in the diodes is dissipated mainly by conduction. Specifically, the heat is conducted from the diodes to housing 106 which also constitutes the heat sink directly in the case of diodes 201, 201' and through diodes 201, 201' in the case of diodes 202, 202'. Diodes 201, 201', 202, and 202' are arranged as columns in a recess 207 of housing 206. Housing 206 thus also constitutes the supporting structure for the diodes. A bearing bracket of the generator may be utilized to constitute housing 206. Contact studs 203 are soldered between diodes 202 and 202'. In a preferred embodiment the contact studs or members are the same as those shown in FIG. 11c. As mentioned above, this construction allows electrical contact to be made between the individual diodes 202 and 202', provides the positive output terminal and decreases any mechanical stresses in the diode columns by a resilient yielding of the two legs of the U shaped body. In FIG. 16, a contact stud 204a is soldered between the cathode of diode 201 and the anode of diode 202. A further contact stud 204a is soldered between diode 201' and diode 202'. The contact studs 204a provide the terminal for connecting the phase conductor 205 of the AC winding of the generator. In the embodiment shown in FIG. 17, contacts 203 are to be connected to each other and to the positive output terminal of the generator.

After the unit has been assembled in housing 206 and soldering of the individual elements has been completed, the opening 207 in housing 206 can be filled with a potting compound or varnished and/or covered with a cover plate. The whole system is thus protected from the environment. Further, any number of columns of diodes can be arranged within opening 207, for example further parallel branches for the bridge rectifier or additional diodes. Further, the so-called exciter diodes, that is the diodes for the known additional half rectifier bridge can also be mounted in opening 207. The contact member shown in FIG. 15b is suitable for the arrangement shown in FIG. 17, while FIG. 15c shows corresponding contact members if two diode columns are to be connected in parallel.

Another preferred embodiment is shown in FIG. 17. Diodes 201' and 202' are replaced by an insulator 209 which electrically isolates diodes 202 from housing 206. This arrangement is suitable for generators with a small power output for which the heat dissipation from diodes 202 through diodes 201 to housing 206 is adequate. For example for a generator having a power output of 700 W, electrical insulator 209 could be made of Resitex, and have the following dimensions: 10 mm×4 mm×2 mm.

In the embodiments of FIGS. 11-17, button diodes are used. These are readily available commercially and are of proven reliability further eliminating the need for development and construction of any new component. The manufacture of rectifier circuits utilizing button diodes is particularly simple since the polarity of such diodes may be reversed simply by turning the diodes around. As a further advantage, the rectifier arrangements according to the present invention allow the use of a bearing bracket of the generator as heat sink. As a particularly simple construction, a diode column can be formed and the contact members which are soldered between the individual diodes constitute both the electrical connection between the individual button diodes and the terminals to be connected to the AC generator terminals and the generator output terminals. If the contact member is made of resilient material, the mechanical stresses in the individual diode columns which may result from temperature variations during operation of the circuit will be decreased. Finally, the contact members constitute a thermal connection between the individual button diodes. Since cooling of the diodes takes place mainly by conductive heat transfer over further diodes to the metal housing, the whole arrangement can be insulated against the surroundings, for example by a finish or by means of an insulating potting compound. Wiring is considerably simplified since, in the construction as columns, the diode connections are used simultaneously as electrical connecting elements. The compact construction results in a higher resistance to shock and a smaller volume. Since the heat sink for the rectifiers is a unipotential surface, it can be fastened to part of a generator, for example the generator housing or a bearing bracket to which other heat sources, for example the stator are conductively connected. Therefore the rectifier arrangement according to the present invention is suitable for use in generators with surface or jacket cooling for example by means of oil, water or air, without a fan wheel. This results in a substantial decrease in noise particularly at the higher speeds and a decrease in the power requirements. The decrease in power requirements in turn results in a decrease of the requirements for the drive belt and the ball bearings. The upper speed limit of the generator is no longer determined by the characteristics of the fan wheel and its noise. Due to the decrease in inertia of the resulting smaller generator the dynamic behavior and the lifetime of the operating elements is decreased for equal power outputs.

Various changes and modifications may be made within the scope of the inventive concepts.

I claim:

1. In a semiconductor arrangement having a single metallic base member (11) constituting a heat sink, a plurality of first semiconductor elements (13) mounted on said single metallic base member and electrical conductor means connected to at least one of said semiconductor elements for providing electrical contact thereto, the improvement comprising
    electrical insulator means (19) having a high thermal conductivity interposed between said first semiconductor elements and said metallic base member for electrically insulating said single metallic base member from said semiconductor elements, said electrical insulator means comprising a plurality of second semiconductor elements connected to said first semiconductor elements, said second semiconductor elements being always in the blocked state.

2. A semiconductor arrangement as set forth in claim 1, wherein said electrical conductor means (15) is soldered to said semiconductor elements.

3. A semiconductor arrangement as set forth in claim 1, wherein each of said second semiconductor elements is connected to one of said first semiconductor elements with opposite polarity thereto.

4. A semiconductor arrangement as set forth in claim 3, wherein said plurality of second semiconductor elements comprises a plurality of insulating diodes; and
    wherein said plurality of insulating diodes comprises a first set of insulating diodes (22) having a p layer and a second set of insulating diodes (22) having an n layer in contact with said metallic base member (25).

5. A semiconductor arrangement as set forth in claim 3,
    wherein said plurality of first semiconductor elements comprises a first set of active diodes directly mounted on said metallic base member and a second set of active diodes; and
    wherein said plurality of second semiconductor elements comprises a set of insulating diodes (22) connected between said second set of active diodes and said metallic base member.

6. A semiconductor arrangement as set forth in claim 3, wherein said plurality of first semiconductor elements comprises six active diodes and said plurality of second semiconductor elements comprises six insulating diodes connected between said six active diodes and said metallic base member; further comprising connecting means for interconnecting said diodes to form an AC bridge rectifier.

7. A semiconductor arrangement as set forth in claim 6, wherein said AC bridge rectifier has a first, second and third AC input terminal and a positive and negative bridge output terminal; and wherein said connecting means comprises means for connecting a first, second and third of said six active diodes to said negative bridge output terminal and a fourth, fifth and sixth of said six active diodes to said positive bridge output terminal.

8. A semiconductor arrangement as set forth in claim 5, wherein said first set of active diodes comprises three diodes and said second set of active diodes comprises three diodes; further comprising three additional diodes, each connected with opposite polarity to one of said first set of active diodes, thereby creating three diode pairs; wherein said second set of active diodes and said plurality of insulating diodes constitute three diode pairs substantially indentical to said first-mentioned three diode pairs; further comprising connecting means for interconnecting said active diodes to form an AC bridge rectifier circuit.

9. A semiconductor arrangement as set forth in claim 8, wherein said connecting means comprises a first, second and third AC input terminal, means for connecting said first, second and third diode of said first set of active diodes to said first, second and third AC input terminal respectively, a positive bridge output terminal, a negative bridge output terminal, means for connecting said second set of diodes to said positive bridge output terminal and means for connecting said negative bridge output terminal to said metallic base member.

10. A semiconductor arrangement as set forth in claim 9, further comprising at least one control output terminal, and means for connecting said three additional diodes to said control output terminal (K).

11. A semiconductor arrangement as set forth in claim 1, wherein said first semiconductor element comprises a controllable rectifier.

12. A semiconductor arrangement as set forth in claim 1, further comprising a cooling plate (17); and wherein said metallic base member is set into said cooling plate.

13. A semiconductor arrangement as set forth in claim 12, wherein said metallic base member and said cooling plate constitute said heat sink.

14. In an AC generator having a plurality of AC terminals for furnishing an AC signal, a rectifier arrangement comprising a plurality of first button diodes (102) connected to said AC terminals (104) for rectifying said AC signal; support means (106) for supporting said first button diodes within said generator said support means also constituting a heat sink; and insulating means (103) comprising a plurality of second button diodes interconnected between said first button diodes and said support means for conducting heat from said first button diodes to said support means while electrically insulating said first button diodes from said support means.

15. A rectifier arrangement as set forth in claim 14, wherein said AC generator furnishes a three-phase signal;
   wherein two of said first button diodes are associated with each of said phases; and
   wherein each two of said first diodes associated with each of said phases and one of said second diodes are mounted one on top of the other within said support means, whereby three diode columns are formed.

16. A rectifier arrangement as set forth in claim 15, further comprising contact members (104, 105) for providing electrical contact among said first button diodes and constituting a rectifier terminal.

17. A rectifier arrangement as set forth in claim 16, wherein said rectifier column has a main axis; and
   wherein said contact member is resilient in the direction of said main axis.

18. A rectifier arrangement as set forth in claim 16, wherein said contact member further constitutes a thermal contact between diodes connected thereto.

19. A rectifier arrangement as set forth in claim 15, wherein said support member comprises a first unit (108) constituting a diode mounting and a second member (106a) constituting a heat sink and mounting support.

20. A rectifier arrangement as set forth in claim 15, further comprising a protective covering for said diodes.

21. A rectifier arrangement as set forth in claim 20, wherein said protective covering is an insulating lacquer.

22. A rectifier arrangement as set forth in claim 20, wherein said protective covering is an insulating potting compound (110).

23. A rectifier arrangement as set forth in claim 14, wherein said AC generator has a bearing plate; and
   wherein said bearing plate constitutes said heat sink.

24. A semiconductor arrangement as set forth in claim 1, further comprising sheathing means (16) connected to said base member for forming with said base member a housing surrounding said first semiconductor elements; and wherein said electrical conductor means (15) is insulated from said sheathing and passes therethrough.

* * * * *